United States Patent [19]

Abe

[11] 4,070,664
[45] Jan. 24, 1978

[54] KEY CONTROLLED DIGITAL SYSTEM HAVING SEPARATED DISPLAY PERIODS AND KEY INPUT PERIODS

[75] Inventor: Masayoshi Abe, Kokubunji, Japan

[73] Assignee: Hitachi, Ltd., Japan

[21] Appl. No.: 699,223

[22] Filed: June 23, 1976

[30] Foreign Application Priority Data

July 2, 1975 Japan .................................. 50-80893

[51] Int. Cl.² .............................................. G09F 9/32
[52] U.S. Cl. ............................... 340/337; 340/324 M; 340/336; 340/365 R
[58] Field of Search .................. 340/336, 337, 324 M, 340/365 R

[56] References Cited

U.S. PATENT DOCUMENTS

| | | | |
|---|---|---|---|
| 3,836,903 | 9/1974 | Lawrence | 340/336 |
| 3,848,250 | 11/1974 | Kashio | 340/336 |
| 3,969,717 | 7/1976 | Hatsukano et al. | 340/336 |
| 3,990,070 | 11/1976 | Spence | 340/337 |

*Primary Examiner*—Marshall M. Curtis
*Attorney, Agent, or Firm*—Craig & Antonelli

[57] ABSTRACT

In a digital system including a digital computing module which generates a repeating sequential series of first pulses and a group of second pulses simultaneously with each of first pulses for energizing a dynamic numerical display device and to which key input information is coupled as timing pulses, during a first period of a predetermined time interval the display device is driven by the first and second pulses while during a second period of the predetermined time interval the display device is not driven but the timing pulses are coupled to the computing module.

4 Claims, 8 Drawing Figures

KEY CONTROLLED DIGITAL SYSTEM HAVING SEPARATED DISPLAY PERIODS AND KEY INPUT PERIODS

BACKGROUND OF THE INVENTION

1. Field of the Invention

The present invention relates to a key controlled digital system and is adapted mainly for electronic desk-top computers or calculators.

2. Description of the Prior Art

In a key controlled digital system such as an electronic desk-top computer or calculator, the main portion of the digital circuit is constituted in a form of MIS (Metal-Insulator-Semiconductor) integrated circuit. In general, the number of the external terminals of semiconductor integrated circuits is severely limited. In the case of the electronic desk-top computer, therefore, signals from a keyboard are first converted to timing pulses and then applied to the external terminals of the semiconductor integrated circuit in a multiplex fashion so that the number of the external terminals may be reduced.

An example of such a digital system as described above is disclosed in U.S. Pat. No. 3,781,852. According to this patent, a multidigit numerical display device is energized by a repeating sequential series of digit pulses and a group of segment pulses. The digit pulses are coupled to the keys of a keyboard and are input to a digital computing module when the associated keys are depressed or actuated. Coding for the actuated key is performed internally of the computing module. In this digital system, however, the digit pulses and the segment pulses are both applied to the display device even during a key input period in which the digit pulses are coupled to the keyboard and hence the computing module, so that the electric power consumption by the display device is comparatively large. Moreover, in the case where fluorescent display tubes are used for the display device, the electric power consumption by the tubes becomes relatively large so that the current capacity of the digit pulse supplying drive circuit constituted of MISFET's must be large. Accordingly, the loss in the output level of the digit pulse on the side of a reference potential becomes large. This results in the deterioration of key input level.

SUMMARY OF THE INVENTION

An object of the present invention is to provide a key controlled digital system which is free from the above-described problems.

A digital system according to the present invention comprises a numerical display means having plural display elements arranged in digit positions respectively and energized sequentially, a digital computing module for generating a repeating sequential series of first pulses and a group of second pulses simultaneously with each of the first pulses for selective energization of the display elements, and a keyboard means having keys whose actuation effects the coupling of timing pulses to the computing module. The feature of the digital system according to the present invention lies in that the computing module includes a display timing circuit means for receiving the first pulses to cause the supplying of the first pulses to the display means to allow during a first period of each of periodic predetermined time intervals and to inhibit during a second period of the predetermined time interval, and a key input timing circuit means for receiving the second pulses and the timing pulses to supply the second pulses to the display means during the first period of the predetermined time interval and to couple the timing pulses to the computing module during the second period of the predetermined time inverval.

In the digital system of the present invention in which the display timing circuit means and the key input timing circuit means are provided, a display period in which the display means is driven is separated from a key input period in which the timing pulses are coupled to the computing module, so that power consumption can be decreased. Moreover, the digit pulses are not supplied to the display means during the key input period so that there is no loss in an output level of the digit pulse on the side of a reference potential. This means that a key input level is no deteriorated.

DESCRIPTION OF THE PREFERRED EMBODIMENTS

Prior to explanation of the preferred embodiments of the present invention, an example of a conventional key controlled digital system will be explained with the aid of FIGS. 1, 2A and 2B.

Figure 1:
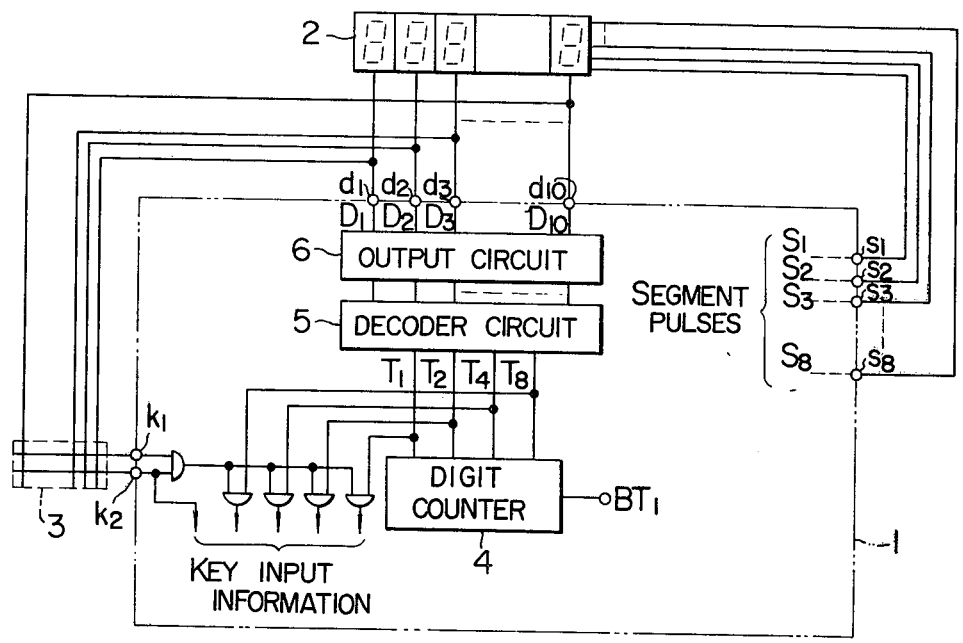
FIG. 1 is a block diagram of a conventional key controlled digital system.
Figure 2A:
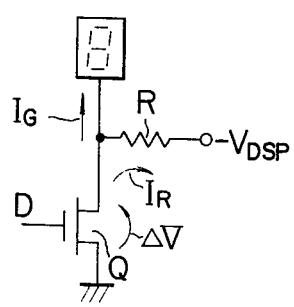
FIGS. 2A and 2B show a circuit for driving a display device and the output waveform of the circuit, respectively.
Figure 2B:
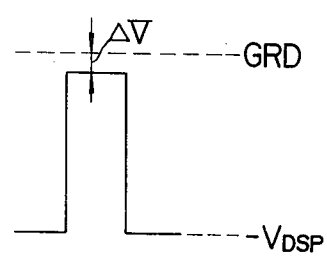

In FIG. 1, reference numeral 1 indicates a computing module composed of semiconductor integrated circuits. The computing module 1 may be of any type that performs desired arithmetic opertions under control of a keyboard 3 having numeral and function keys and generates signals for displaying the results of the arithmetic operations on a multi-digit numerical display device 2. The multi-digit numerical display device 2 has plural display elements arranged in digit positions respectively, each display element including one digit electrode and seven segment electrodes capable of depicting numerals 0 to 9. Each display element may include an additional segment electrode such as a decimal point. The corresponding segment electrodes of the respective digits are commonly connected. The computing module 1 comprises a digit counter 4, a decoder circuit 5 and an output circuit 6 and generates a repeating sequential series of digit pulses $D_1 - D_{10}$ at terminals $d_1 - d_{10}$. Simultaneously with the generation of each digit pulse, a circuit not shown generates segment pulses $S_1 - S_8$ at terminals $s_1 - s_8$. The segment pulses and the digit pulses are applied to the display device 2 and the display elements of the device 2 are selectively energized in sequence from the lowest digit up to the highest one. The digit pulses $D_1 - D_{10}$ are coupled to the keys in the keyboard 3 respectively and the output of the keyboard 3 are commonly coupled to the computing module 1. Namely, each digit pulse is coupled to the computing module 1 when the associated key is acutated or depressed. Thus, the digit pulses are used as timing pulses.

The computing module 1 interpretes the timing pulses through binary coding. In the simplest example of this, as seen in FIG. 1, the timing pulses are used to control the gate circuit so that the countingpatterns of the digit counter 4 are taken out as binary input signals. For example, if the digit pulse $D_5$ is coupled to the key for numeral 5, the gate circuit is enabled when the outputs of the bit counter 4 are "0," "1," "0" and "1." As a result, this binary-coded pattern is derived as the information corresponding to the key of numeral 5. An example of such a digital system is disclosed in the aforementioned U.S. Pat. No. 3,781,852, which can be referred to for the interconnection of electrodes in the display device, the generation of digit pulses and segment pulses, the coupling between the digit pulses and the keys within the keyboard, and the coding of the timing pulses in the computing module.

In such a conventional digital system, the decrease in the number of the key input terminals can be attained but there are the following problems. Namely, since the digit pulses and the segment pulses are both applied to the display device even during the key input period in which the digit pulses are coupled to the keyboard and hence the computing module, the electric power consumption in the display device is comparatively large. Moreover, in the case where fluorescent display tubes are used for the display device, the fluorescent display tubes consume comparatively large current (1.5 mA) and the drive circuit constituted of MISFET's also conducts a relatively large current, so that the loss in the output level of the digit pulse on the side of a reference potential becomes large. More especially, a fluorescent display tube generally includes a cathode (bias electrode), seven anodes (segment electrodes) and grid (digit electrode). The cathode, anodes and grid are applied with a bias voltage of about $-20$ V, segment pulses and digit pulse respectively. A driving MISFET Q as shown in FIG. 2A is to supply currents $I_R$ an $I_G$ respectively for a load resistor R and the grid of the fluorescent display tube, so that the voltage drop $\Delta V$ due to these currents $I_R$ and $I_G$ becomes large and the output level is then large ($-1.5 \sim -2.0$ V) with respect to the reference voltage. In the case where such a signal as shown in FIG. 2B is used as a key input coupled to the computing module through the keyboard, it is necessary to make the input level of the logic circuit constituted of MISFET on the side of the reference potential less in absolute value than 1.3 V. Accordingly, the driving capacity of the drive circuit must be increased so as to improve the level on the reference potential.

The above-described problems in the conventional digital system can be solved by the present invention in which during a first period of each of periodic predetermined time intervals the display device is driven while during a second period of the predetermined time interval the timing pulses are coupled to the computing module but the display device is not driven.

The preferred embodiments of the present invention will now be explained with the aid of the attached drawings.

Figure 3:
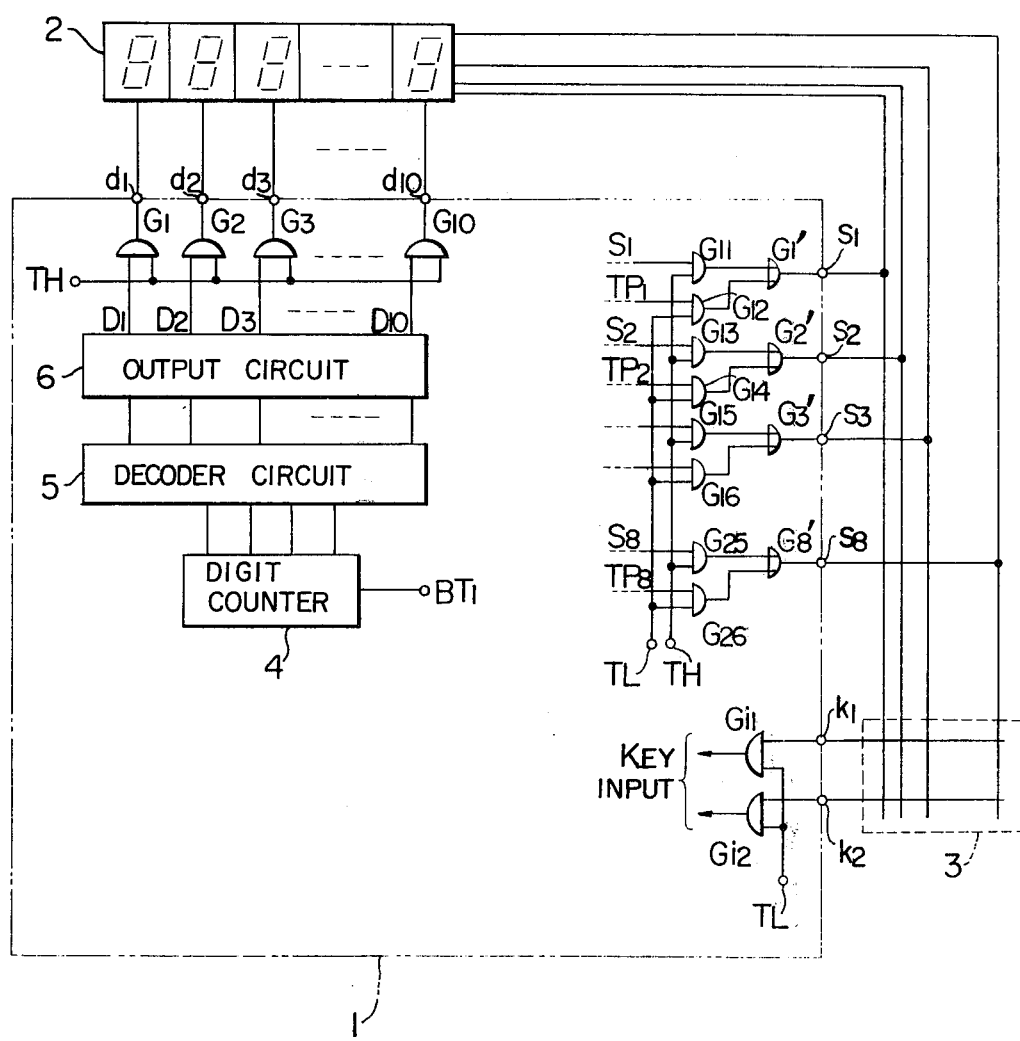
FIG. 3 is a block diagram of a key controlled digital system according to an embodiment of the present invention.

FIG. 3 is a block diagram of the main portions of an embodiment of the present invention applied to an electronic desk-top computer. In the figure, the same reference numerals or symbols as used in FIG. 1 indicate like parts or elements. In this embodiment, timing pulses used as key input are derived from the segment terminals $s_1 - s_8$. A display timing circuit includes AND gates $G_1 - G_{10}$. A key input timing circuit includes AND gate $G_{11} - G_{26}$ and OR gates $G_1' - G_8'$. The computing module 1 generates a repeating sequential series of digit pulses $D_1 - D_{10}$ and a group of segment pulses $S_1 - S_8$ simultaneously with each of the digit pulses for driving the numerical display device 2.

The digit pulses $D_1 - D_{10}$ are applied to the AND gates $G_1 - G_{10}$ which are controlled by a timing signal TH. The digit pulses $D_1 - D_{10}$ are delivered at the digit terminals $d_1 - d_{10}$ only when the timing signal is being generated, and the pulses $D_1 - D_{10}$ at the terminals $d_1 - d_{10}$ are applied to the display device 2.

The segment pulses $S_1 - S_8$ are applied to the key input timing circuit including the AND gates $G_{11} - G_{26}$ and the OR gates $G_1' - G_8'$. A series of timing pulses $TP_1 - TP_8$ generated from a circuit not shown are also applied to the key input timing circuit. The key input timing circuit is controlled by the timing signal TL and a timing signal TH opposite in phase to the timing signal TL so as to change over the segment pulses $S_1 - S_8$ and the timing pulses $TP_1 - TP_8$. The key input timing circuit delivers the segment pulses $S_1 - S_8$ at the segment terminals $s_1 - s_8$ during the duration of the generation of the timing signal TH, so that the segment pulses $S_1 - S_8$ are applied to the display device. During the duration of the generation of the timing signal TL, the key input timing circuit delivers the timing pulses $TP_1 - TP_8$ at the segment terminals $s_1 - s_8$, so that the timing pulses $S_1 - S_8$ are coupled to the keyboard 3 as key input signals. The computing module 1 receives the key input signals or timing pulses through gates $G_{f1}$ and $G_{f2}$ which are in turn controlled by the timing signal TL.

Consequently, in the duration of the timing signal TH, the digit pulses and the segment pulses can be applied to the display device 2 through the display timing circuit and the key input timing circuit respectively so that the display device is driven. In the duration of the timing signal TL, on the other hand, the digit pulses and the segment pulses are inhibited from passing through the display timing circuit and the key input timing circuit respectively but the timing pulses $TP_1 - TP_8$ are applied through the key input timing circuit to the keyboard 3 and hence to the computing module 1, so that the display device is not driven but the coupling of the key input to the computing module 1 is effected.

Figure 4:
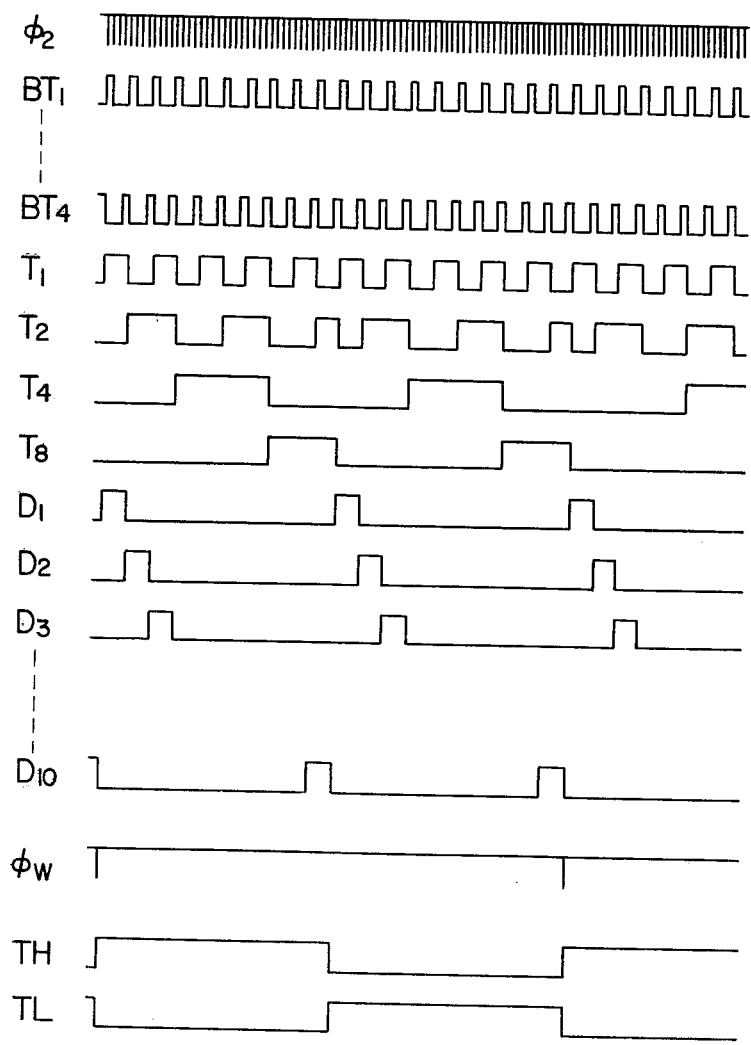
FIG. 4 shows pulse and signal waveforms for explaining the present invention.
Figure 5A:
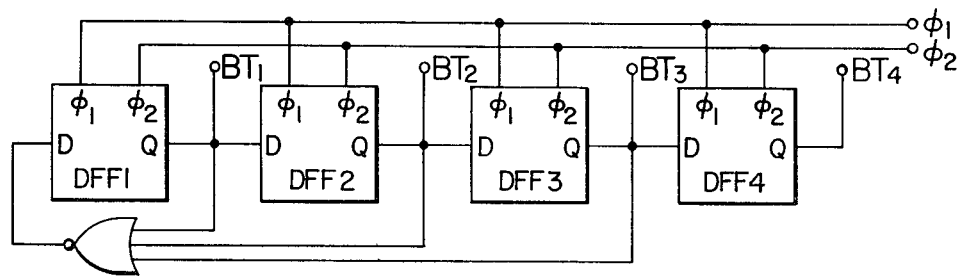
FIGS. 5A, 5B and 5C show examples of circuits for generating pulses and signals shown in FIG. 4.
Figure 5B:
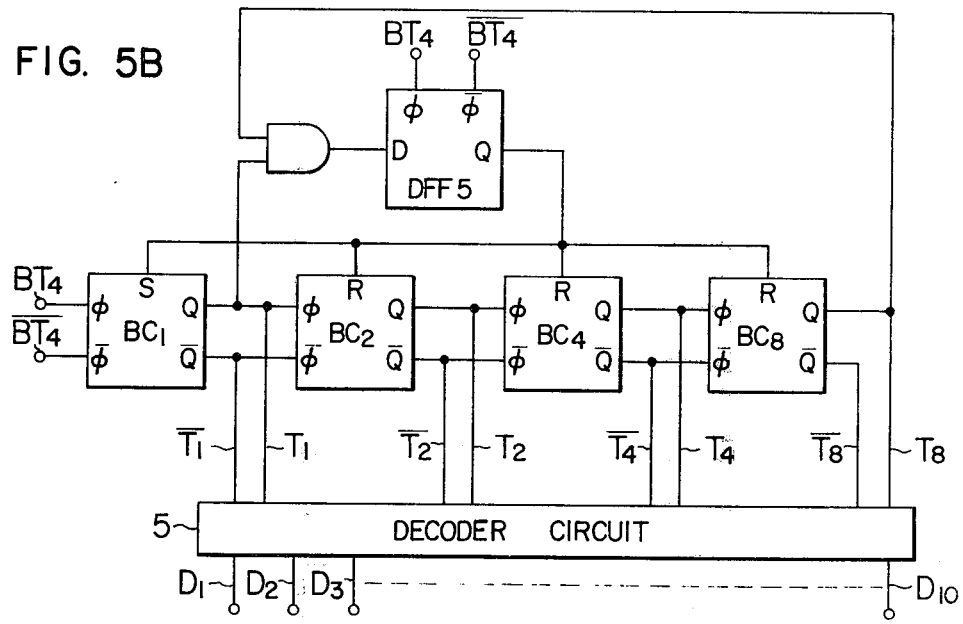
Figure 5C:
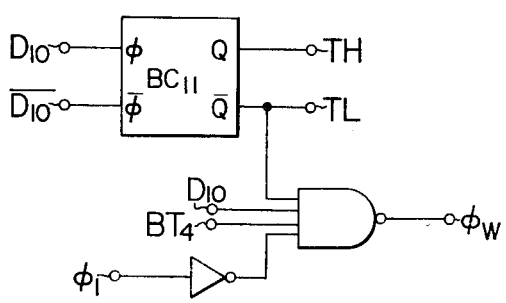

FIG. 4 shows the pulse and signal waveforms used in the present invention. FIGS. 5A, 5B and 5C show examples of concrete circuits for generating the pulses and signals shown in FIG. 4. Bit pulses $BT_1 - BT_4$ are generated on the basis of clock pulses $\phi_2$ by a bit timing generator in a form of a ring counter which includes delayed flip-flops DFF1 – DFF4 (see FIG. 5A). Information is written in the flip-flops DFF1 – DFF4 when $\phi_1 =$ "0" while the information is read out of the flip-flops when $\phi_2 =$ "0". The bit pulses $BT_4$ are counted by a bit counter 4 which includes binary counters $BC_1$, $BC_2$, $BC_4$ and $BC_8$ and delayed flip-flops DFF5 (see FIG. 5B). In each of the binary counters $BC_1$, $BC_2$, $BC_4$ and $BC_8$, an inverted output Q is derived when $\phi =$ "0" while the previous state is maintained when $\phi =$ "0". Terminals S and R are direct set and reset terminals to render the outputs of the counters of "1" and "0", respectively, independent of whether $\phi$ equals "0" or "1". As to the flip-flop DFF5, information is written in when $\phi = $ "1" and read out when $\phi = $ "0". The bit counter delivers output pulses $T_1 - T_8$. The decoder circuit 5 forms digit pulses $D_1 - D_{10}$ on the basis of the outputs of the bit counter. A word pulse is designated by $\phi_w$ and the system operation timing of 1 word with 2 cycles is employed in the present embodiment. Accordingly, each word pulse $\phi_w$ is generated every 80 bits when the register has a capacity of 40 bits. In this timing of 1 word with 2 cycles, the timing signal TH is generated during the earlier cycle and the timing signal TL during the later cycle. FIG. 5C shows a word timing generator circuit for generating the word pulse $\phi_w$ and the timing signals TH and TL.

According to the above-described arrangement, when the digit pulses are used as a key input, the segment pulses are inhibited from being applied to the display device so that the display device is not driven. Accordingly, the digit pulse output circuit does not supply current for the display device and therefore no loss is caused in the output level on the side of the reference potential. Namely, even if the pulses are used as the key input, the output level of the MIS logic circuit on the side of the reference potential can be maintained sufficiently high. Moreover, when the display device is driven, the digit pulses are inhibited by the gates $G_{f1}$ and $G_{f2}$ so that no indefinite level is applied as key input signal. Consequently, the loss in the level on the side of the reference potential is small in the digit pulse output circuit, the current capacity of the driving MISFET need not be higher than necessary and the power consumption is not large. Further, according to the present invention, the key input period is separated from the display period so that the latter is half the corresponding period in a conventional system, whereby the power consumption can be reduced to a considerable extent.

Although the present invention has been described only by way of the specified embodiment, it is by no means limited to the described embodiment, but admits of numerous modifications and variations.

The present invention can be widely applied to such a key controlled digital system such as an electronic desk-top computer having a dynamic numerical display device.

Any suitable, well-known techniques can be employed for the coupling between the timing pulses and the keys of the keyboard, the coding of the timing pulses in the computing module, the generation of the digit and segment pulses and the constitution and the interconnection of the display elements of the display device. The above-mentioned U.S. Pat. No. 3,781,852 is one of examples.

I claim:

1. In a digital system comprising a character display means having plural display elements arranged in digit positions respectively and energized sequentially, a digital computing module for generating a repeating sequential series of first pulses and a group of second pulses simultaneously with each of said first pulses for selective energization of said display elements, and a keyboard means having keys whose actuation effects the coupling of timing pulses to said computing module, said timing pulses being provided for the coding of information corresponding to the actuated key, the improvement wherein said computing module comprises a display timing circuit means for receiving said first pulses, said display timing circuit means being arranged for enabling the supplying of said first pulses to said display means during a first period of each of predetermined time intervals and for inhibiting the supplying of said first pulses to said display means during a second period of the predetermined time interval, and a key input timing circuit means for receiving said second pulses and said timing pulses, said key input timing circuit means being arranged for supplying said second pulses to said display means during said first period of the predetermined time interval and for coupling said timing pulses to said computing module during said second period of the predetermined time interval, whereby selective energization of said display elements is enabled during said first period and not during said second period when said timing pulses are coupled to said computing module.

2. A digital system according to claim 1, wherein said computing module further comprises means for internally generating said timing pulses, said timing pulses being applied through said key input timing circuit means to said keyboard means with said timing pulses being coupled back to said computing module when a selected one of said keys is actuated.

3. A digital system according to claim 2, wherein said display timing circuit comprises a first group of AND gates having their respective first inputs coupled to said first pulses and their respective second inputs coupled to a first pulse signal whose pulse duration corresponds to said first period, and said key input timing circuit means comprises a second group of AND gates having their respective first inputs coupled to said second pulses and their respective second inputs coupled to said first pulse signal, a third group of AND gates having their respective first inputs coupled to said timing pulses and their respective second inputs coupled to a second pulse signal whose pulse duration corresponds to said second period, and a first group of OR gates having their respective first inputs coupled to the respective outputs of the AND gates of said second group and their respective second inputs coupled to the respective outputs of the AND gates of said third group.

4. A digital system according to claim 1, wherein said first and second periods of the predetermined time interval are separate periods, said first period being a display period wherein selective energization of said display elements is effected by said first and second pulses, said second period being a key input period wherein the generation of said first and second pulses does not effect energization of said display elements and with said timing pulses being coupled to said computing module.

* * * * *